United States Patent [19]

Kasperkovitz et al.

[11] Patent Number: 5,572,164

[45] Date of Patent: Nov. 5, 1996

[54] FM DEMODULATOR WITH THRESHOLD EXTENSION AND RECEIVER COMPRISING SUCH AN FM DEMODULATOR

[75] Inventors: Wolfdietrich G. Kasperkovitz; Robert F. E. Kokke, both of Eindhoven, Netherlands

[73] Assignee: U.S. Philips Corporation, New York, N.Y.

[21] Appl. No.: 528,277

[22] Filed: Sep. 14, 1995

[30]     Foreign Application Priority Data

Sep. 30, 1994  [EP]  European Pat. Off. .............. 94202823

[51] Int. Cl.⁶ ......................................................... H03D 3/00
[52] U.S. Cl. ........................... 329/315; 329/319; 329/337; 455/207; 455/337
[58] Field of Search ................................. 329/315, 319, 329/325, 326, 337; 331/23; 455/208, 337, 205, 207, 214

[56]            References Cited

U.S. PATENT DOCUMENTS

| | | | |
|---|---|---|---|
| 3,611,168 | 10/1971 | Haggai | 329/325 |
| 3,742,361 | 6/1973 | Wason | 329/327 X |
| 4,079,330 | 3/1978 | Ishigaki et al. | 329/134 |
| 4,527,276 | 7/1985 | Gutleber | 329/313 X |
| 4,631,487 | 12/1986 | Beech | 329/351 |
| 4,816,770 | 3/1989 | Naumann | 329/318 |
| 4,914,408 | 4/1990 | Voorman | 333/167 |
| 5,034,695 | 7/1991 | Owen | 455/208 X |
| 5,095,536 | 3/1992 | Loper | 455/337 X |
| 5,220,686 | 6/1993 | Kasperkovitz et al. | 455/234 |
| 5,341,107 | 8/1994 | Bijker et al. | 329/337 |

*Primary Examiner*—David Mis
*Attorney, Agent, or Firm*—Edward W. Goodman

[57]                ABSTRACT

An FM demodulator having two input terminals (11, 12), to which FM input signals having 90° phase relation are applied, the said FM demodulator including a phase comparator (1) and a tunable, phase shifting circuit (2), the phase shifting circuit (2) being tuned by the FM demodulator output signal via a feedback path comprising a loop, filter. By adding a compensation filter (5) to the tuning control loop the phase shifting circuit is effectively cancelled from the tuning control loop, thereby making the tuning control loop independent of the bandwidth of the phase shifting circuit (2). Thus the bandwidth of the phase shifting circuit (2) can be reduced for threshold extension.

10 Claims, 2 Drawing Sheets

FM DEMODULATOR WITH THRESHOLD EXTENSION AND RECEIVER COMPRISING SUCH AN FM DEMODULATOR

BACKGROUND OF THE INVENTION

1. Field of the Invention

The invention relates to an FM demodulator having a first and a second input terminal for receiving FM modulated input signals having a 90° degree phase relation, and an output terminal for supplying a demodulated FM signal, said FM demodulator comprising:

a phase comparator having a first and second input and an output, said first input being coupled to the first input terminal of said FM demodulator and said output being coupled to the output terminal of said FM demodulator.

a first tunable phase shifting means coupled between the second input terminal of said FM demodulator and the second input of said phase comparator, said first tunable phase shifting means comprising a tuning control input for controlling a tuning frequency of said first phase shifting means, a feedback path from the output of said phase comparator to said tuning control input, comprising a loop filter.

The invention also relates to a receiver for receiving FM signals, comprising an RF stage, an IF stage, an FM demodulator and an LF stage.

2. Description of the Related Art

An FM demodulator as described in the opening paragraph is known from the European Patent Application EP-A 574, corresponding to U.S. Pat. No. 5,341,107. In this patent, an FM demodulator is disclosed having a first and a second input terminal and an output terminal. To these input terminals, FM modulated input signals are applied, having a 90° phase relation. In the known FM demodulator, first and second phase shifting means are combined in a polyphase filter having in-phase and quadrature inputs and outputs, and a tuning control input for controlling a tuning frequency of said polyphase filter. The in-phase and quadrature inputs of said polyphase filter are coupled to the first and second input terminals, respectively, and the in-phase and quadrature outputs of the polyphase filter are coupled to second inputs of second and first phase comparators, respectively. Said first and second phase comparators further comprise first inputs, said first inputs being coupled to said first and second input terminals, respectively. Outputs of the first and second phase comparators are coupled to a subtracting stage, an output of said subtracting stage being coupled via a feedback path to the tuning control input of said polyphase filter. Through this feedback path, the tuning frequency of the polyphase filter will track the instantaneous frequency of the FM input signal. Thus, a tuning control loop is realized. By deleting the second phase shifting means, the second phase comparator and the subtracting stage, an asymmetrical FM demodulator is obtained, as these components are not essential to the FM demodulation function per se. In this asymmetrical FM demodulator, a tuning control loop can be identified, comprising the phase shifting means, the phase comparator, and the loop filter. The FM threshold of the FM demodulator is a.o. determined by the bandwidth of the phase shifting means. Thus, a reduction of the bandwidth of the phase shifting means results in a reduced FM threshold. However, such a reduction can lead to instability in the tuning control loop, which makes the known FM demodulator unsuitable for practical use.

SUMMARY OF THE INVENTION

An object of the invention is to provide an FM demodulator, wherein the stability of the tuning control loop is substantially independent of the bandwidth of the phase shifting means.

This object is achieved by an FM demodulator according to the invention, which is characterized in that said feedback path further comprises a compensation filter having a transfer characteristic substantially corresponding to an inverse transfer characteristic of said first phase shifting means transposed to baseband.

The invention is based on the recognition that the transfer characteristic of the phase shifting means for the modulation of the FM input signals can be approximated by a low-pass filter having a transfer characteristic equal to the transfer characteristic of the phase shifting means, transposed to baseband. Thus the transfer characteristic of this low-pass filter will be part of the tuning control loop. When the bandwidth of the phase shifting means is reduced to a value close to the bandwidth of the loop filter, instability can occur. By using the measure according to the invention, the transfer characteristic of the phase shifting means in the tuning control loop is substantially cancelled by the compensation filter. Thus, the phase shifting means is no longer part of the tuning control loop and consequently, the stability of the tuning control loop is no longer affected by the phase shifting means.

A symmetrical embodiment of the FM demodulator according to the invention is character ized in that the FM demodulator further comprises a further phase comparator having a first input, a second input and an output, said first input being coupled to the second input terminal of said FM demodulator, a second tunable phase shifting means substantially corresponding to said first phase shifting means, coupled between said first input terminal of said FM demodulator and the second input of said further phase comparator, in said feedback path, a subtracting stage having a first input, a second input and an output, said first input being connected to the output of said phase comparator, said second input being connected to the output of said further phase comparator, said output being fed back to the tuning control inputs of both first and second phase shifting means, said first and second phase shifting means being part of a resonance amplifier, said resonance amplifier being a polyphase filter having a symmetrical transfer characteristic around its tuning frequency, said polyphase filter having in-phase and quadrature inputs and outputs, said in-phase and quadrature inputs being coupled to the first and second input terminals of the FM demodulator, respectively, and said in-phase and quadrature outputs being coupled to the second inputs of the second and first phase shifting means, respectively.

By this measure an automatic cancellation of harmonics of the carrier frequency is achieved at the output of the subtracting stage. The symmetrical transfer characteristic of a polyphase filter is advantageously used herein to reduce distortion of the demodulated FM signal. The resonance amplifier is an easily integratable realization of a polyphase filter having a first-order band-pass transfer characteristic.

An embodiment of the FM demodulator according to the invention is characterized in that said loop filter comprises a first-order low-pass filter having a cut-off frequency which is lower than a lowest frequency in the modulation of the FM modulated input signals.

Due to the addition of the compensation filter, the order of the tuning control loop is determined by the loop filter. By using the measure according to the invention, a first-order tuning control loop is achieved, in which the amplitude of the output signal of the FM demodulator is substantially not affected by a reduction of the tuning control loop bandwidth through a reduction of a gain in the tuning control loop.

A further embodiment of the FM demodulator according to the invention characterized in that said first-order low-pass filter is an integrator.

The integrator is a special realization of the loop filter. By using an integrator, the amplitude of the output signal is substantially independent of the gain in the tuning control loop for modulation frequencies falling within the loop bandwidth. Furthermore, the very high gain at low frequencies ensures a correct tuning of the phase shifting means even when no modulation is present.

An embodiment of the FM demodulator according to the invention is characterized in that said integrator and compensation filter are combined in an RC filter, comprising a current source, the current of said current source being controlled proportional to an input signal of said RC filter, a capacitor in series with a resistor, the voltage across the current source being applied to an output of said RC filter for tuning said resonance amplifier via the tuning control input.

The measure according to the invention provides a simple circuit for the realization of the integrator in combination with the compensation filter. This combined integrator and compensation filter is for use in conjunction with phase shifting means comprising a first-order band-pass filter, for example the resonance amplifier as noted above.

An embodiment of the FM demodulator according to the invention in which the bandwidth of the tuning control loop, and thus of the FM demodulator, can be adjusted externally, is characterized in that the FM demodulator further comprises means for providing a variable loop gain, a first control terminal, said terminal being coupled to a variable gain control input of said means for providing a variable loop gain.

The bandwidth of the tuning control loop can be varied by varying the gain in the tuning control loop. In the FM demodulator, this loop gain can be varied by adding means for providing a variable loop gain to the FM demodulator and applying an appropriate control signal to the first control terminal. This measure is especially advantageous in a first-order tuning control loop comprising an integrator, as a variation of the loop gain will only result in a variation of the bandwidth of the tuning control loop, without affecting the amplitude of the output signal of the FM demodulator.

An embodiment of the FM demodulator according to the invention is characterized in that said FM demodulator further comprises a second control terminal coupled to a bandwidth control input of said phase shifting means for controlling the bandwidth of said phase shifting means and coupled to a control input of said compensation filter for matching the transfer characteristic of said compensation filter in accordance with the bandwidth of said phase shifting means.

With this measure, the bandwidth of the phase shifting means can be varied continuously. To allow this continuous control of the bandwidth of the phase shifting means, the transfer characteristic of the compensation filter should be adjusted accordingly to ensure a correct compensation of the transfer characteristic of the phase shifting means by the compensation filter.

A receiver for receiving FM signals comprises according to the invention, an RF stage, an IF stage, the FM demodulator of the subject invention, and an LF stage.

The FM demodulator according to the invention can be used advantageously in a receiver for a.o. improving the signal-to-noise ratio of the receiver.

A receiver for receiving FM signals, in which the bandwidth of the FM demodulator can be varied, comprises according to the invention an RF stage, an IF stage, the FM demodulator and an LF stage, and further comprises demodulator bandwidth control means coupled to the first control terminal of the FM demodulator for controlling the bandwidth of said FM demodulator.

A receiver for receiving FM signals, in which the bandwidth of the phase shifting means can be varied, comprises according to the invention an RF stage, an IF stage, the FM demodulator and an LF stage, further comprising further bandwidth control means coupled to the second control terminal of the FM demodulator for supplying a bandwidth control signal to said second control terminal.

BRIEF DESCRIPTION OF THE DRAWINGS

The above and other features and advantages of the invention will be apparent from the following description of exemplary embodiments of the invention with reference to the accompanying drawings, in which.

Throughout the drawings, similar reference signs denote similar parts.

DESCRIPTION OF THE PREFERRED EMBODIMENTS

Figure 1:
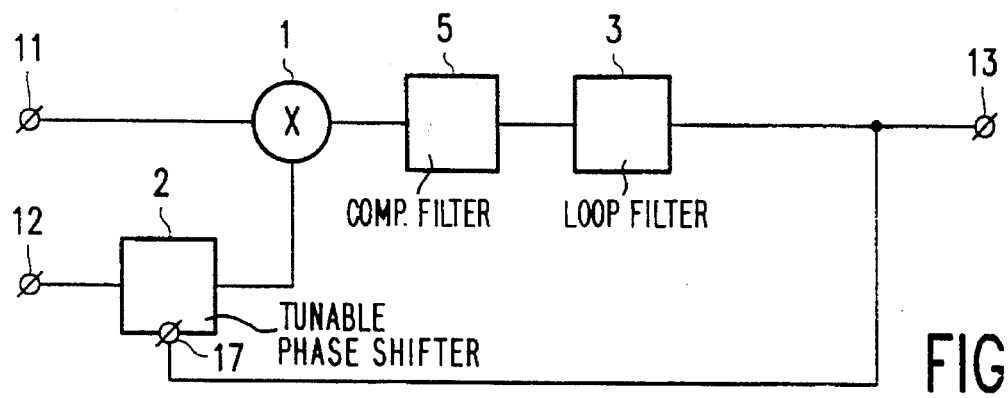
FIG. 1 is a block diagram of a first embodiment of an FM demodulator according to the invention.

FIG. 1 shows a first embodiment of an FM demodulator according to the invention. The FM demodulator comprises a first (11) and a second (12) input terminal for receiving FM input, signals which are in phase quadrature. The FM demodulator further comprises an output terminal 13 supplying an output signal of the FM demodulator, said output signal being the demodulated FM signal. The FM demodulator also comprises a phase comparator 1 having a first input coupled to the first input terminal 11 and having an output coupled to the output terminal 13, as well as a first tunable phase shifting means 2, coupled between the second input terminal 12 and a second input of the phase comparator 1. The first tunable phase shifting means 2 has a tuning control input 17 for controlling the tuning frequency of the first phase shifting means 2, the output of the phase comparator 1 being coupled to said tuning control input 17, according to the invention, via a feedback path comprising a loop filter 3 and a compensation filter 5. Through this feedback path, the tuning frequency of the first phase shifting means 2 will track the modulation of the FM input signals. Thus, a tuning control loop can be identified, comprising the first tunable phase shifting means 2, the phase comparator 1, the loop filter 3 and the compensation filter 5.

The compensation filter 5 has a transfer characteristic substantially corresponding to an inverse transfer characteristic of said first phase shifting means 2 transposed to baseband. In the FM demodulator known from EP-A 574 083, FM threshold extension can be achieved by a reduction of the bandwidth of the first phase shifting means 2. This reduction of the bandwidth is limited, however, due to the fact that the tuning control loop can become unstable. If the bandwidth of the phase shifting means 2 is of the same order of magnitude as the bandwidth of the tuning control loop, ringing or even instability of the tuning control loop may occur. This makes the known FM demodulator unsuitable for achieving FM threshold extension.

Figure 2:
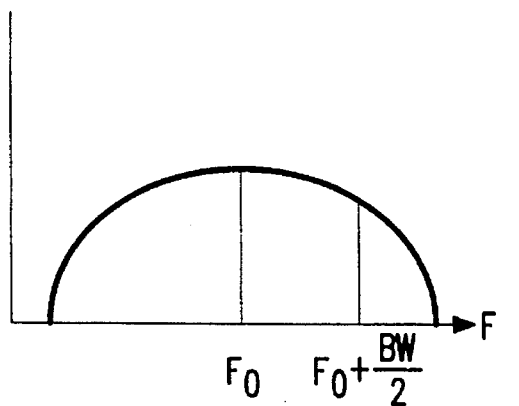
FIG. 2 is a graph of the amplitude versus frequency characteristic of the first phase shifting means.
Figure 3:
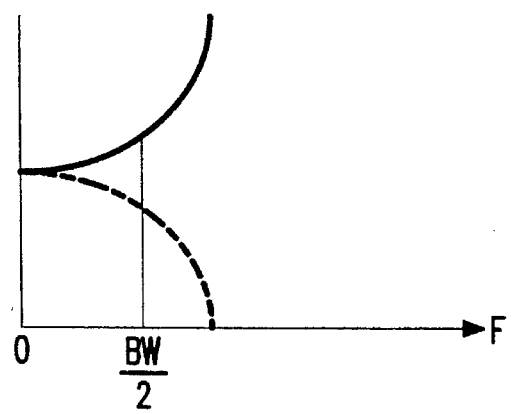
FIG. 3 is a graph of the amplitude versus frequency characteristic of the compensation filter used in conjunction with the first phase shifting means.

The effect of the first phase shifting means 2 on the modulation frequencies contained in the FM input signal is approximation of a filter having a transfer characteristic of the first phase shifting means 2 transposed to baseband. By placing the compensation filter 5, according to the invention, in the tuning control loop, the transfer characteristic of the first phase shifting means 2 is effectively cancelled from the tuning control loop. Thus, the stability and the order of the tuning control loop is now independent of the bandwidth of the first phase shifting means 2, the order of the tuning control loop being determined by the order of the loop filter 3. FIGS. 2 and 3 are an illustration of the compensating effect as described above.

FIG. 2 shows the amplitude versus frequency characteristic of the first phase shifting means 2, which is, in this example a band-pass filter. The first phase shifting means 2 has a center or tuning frequency of Fo and a bandwidth equal to BW.

FIG. 3 shows the amplitude versus frequency characteristic of the first phase shifting means 2 transposed to baseband with a dotted line, and the amplitude versus frequency characteristic of the compensation filter 5 with a solid line. The product of both curves results in a horizontal line parallel to the frequency axis, thus illustrating that the amplitude versus frequency characteristic of the compensation filter 5 is the inverse of the characteristic of the first phase shifting means 2 transposed to baseband. From FIG. 3 it is clear that the compensation filter 5 compensates the roll-off of the first phase shifting means 2. This means that the tracking is no longer affected by the bandwidth of the phase shifting means 2. Thus, FM threshold extension may be achieved by a reduction of the bandwidth of the first phase shifting means 2 without the risk of instability.

Figure 4:
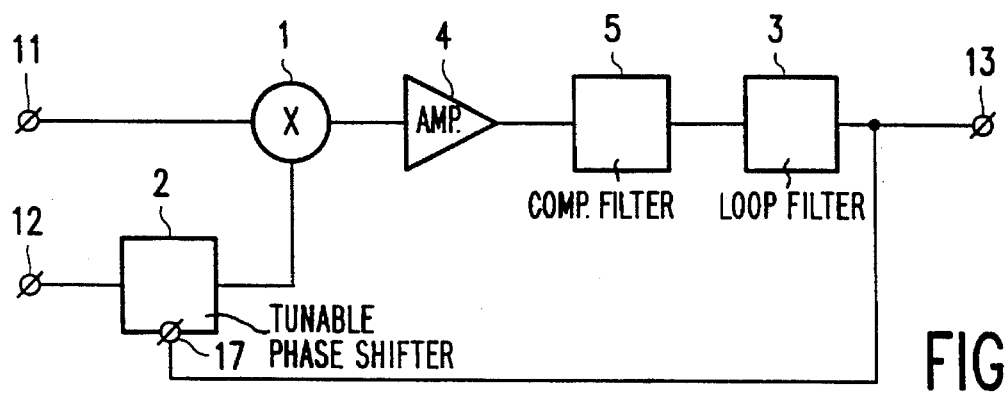
FIG. 4 is a block diagram of a second embodiment of an FM demodulator according to the invention.

FIG. 4 shows a second embodiment of an FM demodulator according to the invention. An amplifier 4 is placed in series with the loop filter 3. The location of the amplifier 4 is not essential, however. It can be located anywhere in the tuning control loop and is intended as a means for providing a gain in the tuning control loop. The loop filter 3 comprises a first-order low-pass filter having a cut-off frequency which is lower than a lowest frequency in the modulation of the FM modulated input signals. A low-pass filter having a high cut-off frequency, as described in U.S. Pat. No. 4,079,330, has as a disadvantage that through a reduction of the gain of the amplifier 4, not only the bandwidth of the tuning control loop is reduced, but also the amplitude of the output signal of the FM demodulator for modulation frequencies which fall within the bandwidth of the tuning control loop, as well as the amplitude of the signal applied to the tuning control input 17 of the first phase shifting means 2. This is caused by the fact that the cut-off frequency of the low-pass filter is chosen too high. Thus a reduction of tuning control loop bandwidth leads to a reduced tracking performance. A reduced tracking performance implies that the carrier of the FM input signal will no longer be in the middle of the pass-band of the first phase shifting means 2, and thus undergoing extra attenuation in the slopes of the pass-band. Thus, the signal power and, consequently, the signal-to-noise ratio at the output of the first phase shifting means 2 are reduced, and as a result, the signal-to-noise ratio of the FM demodulator as well. This means that a reduction of loop bandwidth does not result in a further FM threshold extension.

According to the invention, the loop filter 3 comprises a first-order low-pass filter having a cut-off frequency which is lower than a lowest frequency in the modulation of the FM modulated input signals. Thus, the low-pass filter behaves like an integrator. An integrator in a first-order loop has a main advantage that the bandwidth of the loop is controlled by the gain of the amplifier 4, without affecting the amplitude of the output signal of the FM demodulator for modulation frequencies which fall within the bandwidth of the tuning control loop. This is an essential feature in applications where the loop bandwidth is dynamically changed, for example, in response to changing reception conditions in car radios. Thus, when reducing the loop bandwidth by reducing the gain of the amplifier 4, the tracking will not be affected and the signal power of the output signal of the first phase shifting means 2 will not be reduced for modulation frequencies which fall within the loop bandwidth. This is especially advantageous when the loop bandwidth is low, as low modulation frequencies are usually stronger than high modulation frequencies. Thus, a reduction of the loop bandwidth will result in further FM threshold extension. Furthermore, due to the relatively high gain at low modulation frequencies, the tracking at these low frequencies is improved. In the case of an ideal integrator, the very high DC gain of the integrator will ensure an accurate tracking of the frequency of the FM input signal even when no modulation is present.

The combined measures of a compensation filter 5 and a first-order low-pass filter (or integrator) 3, according to the invention, allow FM threshold extension by a reduction of either the bandwidth of the phase shifting means or the bandwidth of the tuning control loop or even both bandwidths, independently of each other.

Figure 5:
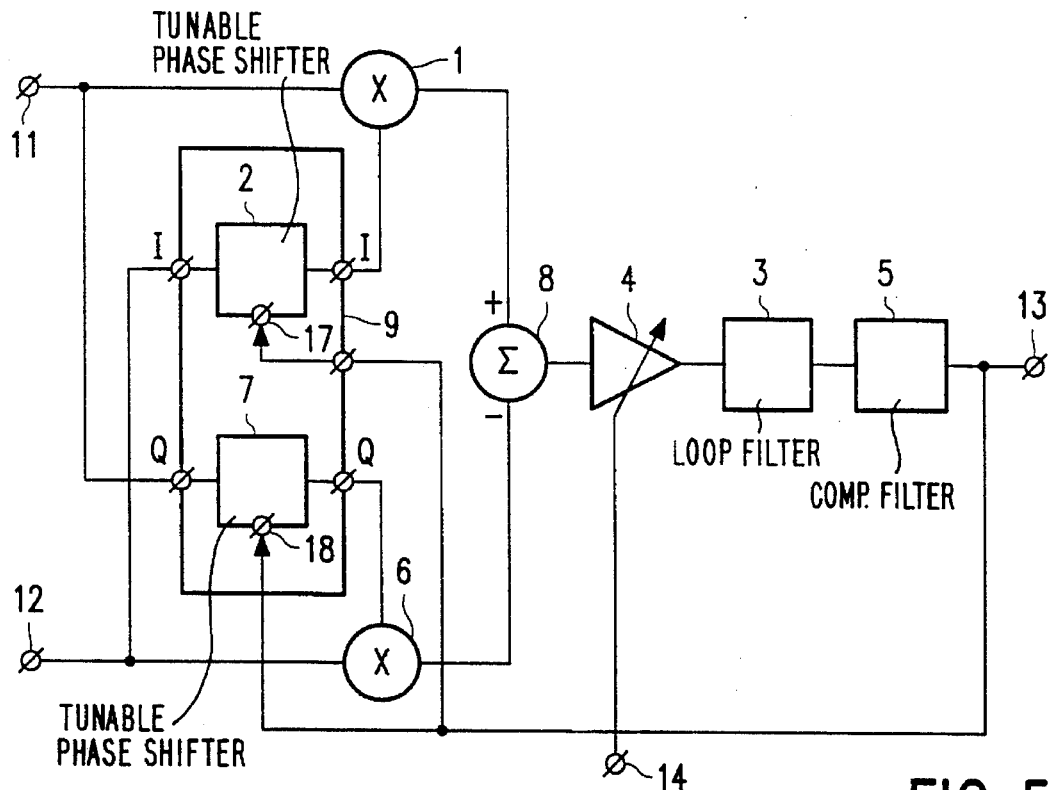
FIG. 5 is a block diagram of a third embodiment of an FM demodulator according to the invention.

FIG. 5 shows a third embodiment of an FM demodulator according to the invention. The FM demodulator of Figure I is extended to a symmetrical FM demodulator by the addition of a further phase comparator 6, a second phase shifting means 7 and a subtracting stage 8. A first input of said further phase comparator 6 is coupled to the second input terminal 12 and an output of the phase comparator 6 is coupled to a second input of the subtracting stage 8. The output of the phase comparator 1 is coupled to a first input of the subtracting stage 8. The second phase shifting means 7 is coupled between the first input terminal 11 and a second input of the second phase comparator 6. Tuning control inputs 17 and 18 of the first and second phase shifting means 2, 7 are both coupled to the output of the subtracting stage 8. Through the symmetry of the construction of the demodulator, the harmonics of the carrier frequency of the FM input signal are cancelled at the output of the subtracting stage 8 if the FM input signals are sinusoidal signals. The feedback path of the FM demodulator shown comprises both the integrator 3 and the compensation filter 5. By this combination, the order of the tuning control loop is determined by the order of the feedback path. As this feedback path comprises an integrator, apart from the compensation filter, the tuning control loop is of the first order. The integrator has a further advantage that due to its very high gain at DC, the tuning frequency of the phase shifting means 2 will accurately track the frequency of the FM input signal even if this signal is unmodulated.

The embodiment in FIG. 5 also comprises means for providing a variable loop gain. The means for providing a variable loop gain is realized in the form of a variable gain stage 4, the gain of said gain stage 4 being be controlled by applying a bandwidth control signal through a gain control input of said variable gain stage, said gain control input constituting a first control terminal 14 of the FM demodulator. This makes an external control of the bandwidth of the tuning control loop, and thus of the bandwidth of the FM demodulator, possible. The means for providing a variable loop gain can be implemented in many ways: a variable gain stage 4 may also be placed before or after the first phase shifting means 2 or even between the input terminal 11 and the first input of the phase comparator 1. Actually, the gain of any of the other blocks in FIG. 4 may be made variable to obtain a variable loop gain. Due to the presence of both the integrator 3 (or the low-pass filter of FIG. 4) and the compensation filter 5 in the tuning control loop, the bandwidth of the tuning control loop can now be varied over a wider range than in the known FM demodulator, as the tuning control loop is made independent of the bandwidth of the phase shifting means 2 by addition of the compensation filter 5 to the tuning control loop.

The first and second phase shifting means 2, 7 can be pan of a polyphase filter 9, said polyphase filter 9 having a symmetrical band-pass characteristic around its tuning frequency and comprising in-phase and quadrature inputs and outputs and, further comprising a tuning control input 17. This is shown with the block 9 drawn around the first and second phase shifting means 2, 7. By using a polyphase filter having a symmetrical band-pass characteristic around its tuning frequency, distortion caused by asymmetry is obviated. Polyphase filters are known from U.S. Pat. No. 4,914, 408. An attractive solution for a polyphase filter is a resonance amplifier as is known from U.S. Pat. No. 5,220,686.

Such a resonance amplifier has a first-order band-pass characteristic. The measures shown in FIG. 5, such as the means for providing a variable loop gain and the inclusion of both integrator (or the low-pass filter of FIG. 4) and compensation filter in the tuning control loop are of course not restricted to the symmetrical embodiment but can also be applied, for example, to the FM demodulators of FIGS. 1 and 4.

Figure 6:
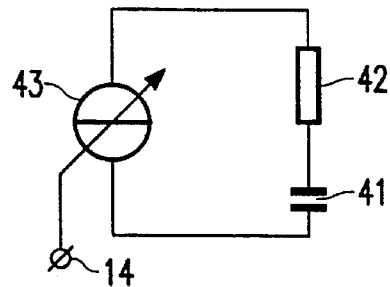
FIG. 6 is a circuit diagram of a combined integrator and compensation filter for use in an FM demodulator according to the invention.
Figure 7:
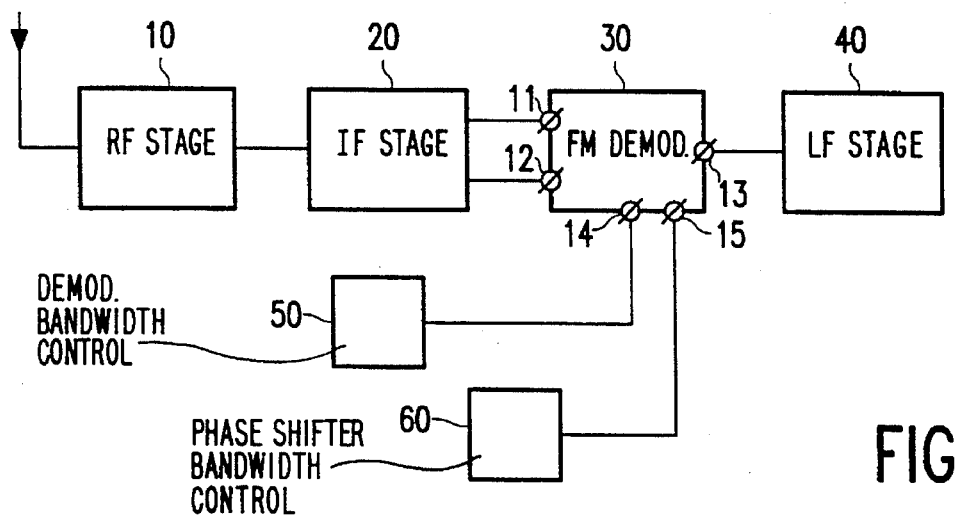
FIG. 7 is a block diagram of an embodiment of a receiver according to the invention.

FIG. 6 shows a combined integrator and compensation filter for use in an FM demodulator according to the invention, said FM demodulator comprising a tunable first-order band-pass filter as a phase shifting means. Such a first-order band-pass filter can be the aforementioned resonance amplifier. The combined integrator and compensation filter comprise a controllable current source 43, the current of said current source 43 being controlled proportional to an input signal of said RC filter. If the integrator and compensation filter of FIG. 5 are combined in the manner described here, said input signal of said RC filter is the output signal of the variable gain stage 4. The combined integrator and compensation filter further comprise an RC filter, comprising a capacitor 41 in series with a resistor 42, coupled to the current source 43. Said RC filter is a first-order filter, suited to compensate the roll-off of a first-order band-pass filter. For this purpose, the cut-off frequency of the RC filter, determined by the product of the values of the resistor 42 and the capacitor 41, is chosen to be equal to half the bandwidth of the first-order band-pass filter. An output signal of said RC filter is proportional to a voltage across the current source 43, and said output voltage can be applied to the tuning control input 17 of the resonance amplifier 9. In FIG. 7, the gain of the current source 43 is also controllable via gain control terminal 14. In this way, the means for providing a variable loop gain is combined with the integrator 3 and the compensation filter 5, thus realizing the blocks 3, 4 and 5 of FIG. 5 in a simple and effective manner.

FIG. 7 shows a receiver for receiving FM signals according to the invention. The receiver comprises an RF stage 10 for receiving a frequency modulated input signal, this signal being converted to an IF frequency and passed to an IF stage 20, where it is filtered and processed and then passed to an FM demodulator 30 comprising a first control terminal 14 as described previously, a low frequency (LF) stage 40 receiving the demodulated signal from the FM demodulator 30. The receiver further comprises a demodulator bandwidth control means 50 coupled to said first control terminal 14 for controlling the bandwidth of the FM demodulator 30 in response to reception conditions. At good reception conditions, the bandwidth may be kept large enough to allow good tracking at high modulation frequencies, whereas under bad reception conditions, interference in the demodulated output signal of the FM demodulator 30 may be reduced by reducing the bandwidth of the FM demodulator 30. Bad reception conditions mean, for example, that the FM input signal undergoes interference from noise (especially when the fieldstrength of the FM input signal is low), a strong adjacent channel or multipath, whereas good reception conditions mean, for example, that the FM input signal is "clean" and undergoes little or no interference. For an automatic control of the FM demodulator bandwidth, the demodulator bandwidth control means 50 may comprise an input for receiving a signal, said signal containing information on the reception conditions. This signal can be a fieldstrength dependent signal supplied by a fieldstrength output terminal of the IF stage 20 or it can be the output signal of the FM demodulator. For example, the output signal of the FM demodulator should, under good reception conditions, only contain the audio information of the FM input signal. This means that other components in the output signal, which may be present, for example in a frequency band above the audio information, are resulting from interference, and the strength of said components are a measure of the amount of interference. By evaluating the strength of these components and adjusting the bandwidth of the FM demodulator 30 accordingly, a continuous demodulator bandwidth control may be achieved for reducing the interference; if the interference increases in strength, the demodulator bandwidth should be reduced and vice versa. A similar evaluation of the fieldstrength dependent signal for controlling the demodulator bandwidth is also possible.

The FM demodulator can also be applied to eliminate pulse shaped noise. To this effect the FM demodulator bandwidth can be reduced to substantially zero, as soon as pulse shape noise is detected. The bandwidth reduction is sustained for the duration of said pulse shaped-noise. An instantaneous reduction of the bandwidth to zero results in "hold" function at the output of the FM demodulator 30; due to the reduction of the bandwidth to zero, the output signal of the FM demodulator 30 is kept at a constant value. In this way, an interference absorption circuit may be realized in combination with the FM demodulator, without a separate mute circuit as in conventional receivers. For this use, the demodulator bandwidth control means 50 may be optimized for detection of said pulse-shaped noise, for example, by using a high-pass filter and detection circuitry as known from the Philips TDA TDA 1001 or TDA 1591/1592 integrated circuits.

In FIG. 7 a further control means 60 is coupled to a second control terminal 15 of the FM demodulator 30, said second control terminal 15 being coupled to a bandwidth control terminal of said phase shifting means (not shown). Said further control means 60 thus controls the bandwidth of the phase shifting means of the FM demodulator 30. As described previously, a reduction of the bandwidth of the phase shifting means results in an improved signal-to-noise ratio at the output of the FM demodulator 30. Furthermore, it may reduce the influence of a strong adjacent channel as this channel will be attenuated in the slope of the transfer characteristic of the phase shifting means. A reduction of the bandwidth of said phase shifting means may, however, result in increased distortion in the output of the FM demodulator, especially at high modulation frequencies, as the compensation filter 5 only compensates the influence of the phase shifting means on modulation frequencies in a first approximation. Despite the possible increase in distortion, a reduced bandwidth may still increase the audio quality in the perception of a listener as this distortion is in exchange for interference, which would be present if the bandwidth of the phase shifting means were not reduced. Thus, it may be desirable to reduce the bandwidth of the phase shifting means under those reception conditions, that would otherwise result in serious interference. For this purpose, the further control means 60 may comprise an input coupled to the output of the FM demodulator or to a fieldstrength output terminal of the IF stage 20, for receiving a signal, representative of reception conditions. The further control means 60 may be in the form of an interference detector for detecting adjacent channel interference, multipath interference or other kinds of interference, not unlike the bandwidth control means 50.

The invention is not restricted to the embodiments given above. FIGS. 2 and 3 are shown as an example to clarify the invention. The product of the two curves in FIG. 3 does not need to result in a horizontal line at unity gain such as shown, but can be at an arbitrary value as long as the line is horizontal.

The phase shifting means can be a filter of arbitrary order and type, providing the compensation filter 5 used is matched according to the invention to this filter order and type.

The sequential order of the functional blocks in the feedback loop can be chosen at will. Furthermore, it is possible to combine several blocks into one block, an example of which is shown in FIG. 6.

The amplitude of the output signal of the FM demodulator can be made independent of variations in amplitude of the FM input signal by preceding the second input or both inputs of the phase comparator 1 with a limiter (not shown).

An additional low-pass filter (not shown) may be added in the tuning control loop to remove the harmonics of the carrier frequency, although this is not necessary in the symmetrical realization of the FM demodulator. When using an additional low-pass filter, the cut-off frequency of this low-pass filter should preferably be chosen higher than the bandwidth of the tuning control loop to avoid instability.

A receiver according to the invention may also comprise an FM demodulator according to the invention, but without control of the demodulator bandwidth or the bandwidth of the phase shifting means in the FM demodulator. On the other hand, a receiver according to the invention may also comprise one or both of the demodulator bandwidth control means 50 and the further control means 60 as shown in FIG. 7, as they can operate independently of each other.

The bandwidth control means 50 and/or further control means 60 of the receiver according to the invention may also have an input coupled to other sources, which contain information about reception conditions, such as the output of a second tuner or a second FM demodulator.

We claim:

1. An FM demodulator having a first input terminal and a second input terminal for receiving FM modulated input signals having a 90° degree phase relation, and an output terminal for supplying a demodulated FM signal, said FM demodulator comprising:

a phase comparator having a first input, a second input and an output, said first input being coupled to the first input terminal of said FM demodulator and said output being coupled to the output terminal of said FM demodulator;

a first tunable phase shifting means coupled between the second input terminal of said FM demodulator and the second input of said phase comparator said first phase shifting means having a tuning control input for controlling a tuning frequency of said first phase shifting means; and a feedback path coupling the output of said phase comparator to said tuning control input, said feedback path comprising a loop filter, characterized in that said feedback path further comprises a compensation filter having a transfer characteristic substantially corresponding to an inverse transfer characteristic of said first phase shifting means transposed to baseband.

2. The FM demodulator of claim 1, characterized in that the FM demodulator further comprises:

a further phase comparator having a first input, a second input and an output, said first input being coupled to the second input terminal of said FM demodulator;

a second tunable phase shifting means, substantially corresponding to said first phase shifting means, coupled between said first input terminal of said FM demodulator and the second input of said further phase comparator;

in said feedback path, a subtracting stage having a first input, a second input and an output, said first input being connected to the output of said phase comparator, said second input being connected to the output of said further phase comparator, said output being fed back to the tuning control inputs of both first and second phase shifting means, said first and second phase shifting means being part of a resonance amplifier, said resonance amplifier being a polyphase filter having a symmetrical transfer characteristic around its tuning frequency, said polyphase filter having in-phase and quadrature inputs and outputs, said in-phase and quadrature inputs being coupled to the first and second input terminals of the FM demodulator, respectively, and said in-phase and quadrature outputs being coupled to the second inputs of the second and first phase shifting means, respectively.

3. The FM demodulator of claim 1, characterized in that said loop filter comprises a first-order low-pass filter having a cut-off frequency which is lower than a lowest frequency in the modulation of the FM modulated input signals.

4. The FM demodulator of claim 3, characterized in that said first-order low-pass filter is an integrator.

5. The FM demodulator according to claim 2, wherein said loop filter comprises a first-order low-pass filter comprising an integrator having a cut-off frequency which is lower that a lowest frequency in the modulation of the FM modulated input signals, characterized in that said integrator and said compensation filter are combined in an RC filter, comprising:

- a current source, a current of said current source being controlled proportional to an input signal of said RC filter; and
- a capacitor in series with a resistor, a voltage across the current source being applied to an output of said RC filter for tuning said resonance amplifier via the tuning control input.

6. The FM demodulator of claim 3, characterized in that the FM demodulator further comprises:

- means for providing a variable loop gain; a first control terminal, said first control terminal being coupled to a variable gain control input of said means for providing a variable loop gain.

7. The FM demodulator of claim 1, characterized in that said FM demodulator further comprises a second control terminal coupled to a bandwidth control input of said phase shifting means for controlling the bandwidth of said phase shifting means and coupled to a control input of said compensation filter for matching the transfer characteristic of said compensation filter in accordance with the bandwidth of said phase shifting means.

8. A receiver for receiving FM signals, comprising an RF stage, an IF stage, an FM demodulator, and an LF stage, wherein said FM demodulator has a first input terminal and a second input terminal for receiving FM modulated input signals having a 90° degree phase relation, and an output terminal for supplying a demodulated FM signal, said FM demodulator comprising:

- a phase comparator having a first input, a second input and an output, said first input being coupled to the first input terminal of said FM demodulator and said output being coupled to the output terminal of said FM demodulator;
- a first tunable phase shifting means coupled between the second input terminal of said FM demodulator and the second input of said phase comparator, said first phase shifting means having a tuning control input for controlling a tuning frequency of said first phase shifting means; and
- a feedback path coupling the output of said phase comparator to said tuning control input, said feedback path comprising a loop filter, characterized in that said feedback path further comprises a compensation filter having a transfer characteristic substantially corresponding to an inverse transfer characteristic of said first phase shifting means transposed to baseband.

9. A receiver for receiving FM signals, comprising an RF stage, an IF stage an FM demodulator, and an LF stage, said FM demodulator having a first input terminal and a second input terminal for receiving FM modulated input signals having a 90° degree phase relation, and an output terminal for supplying a demodulated FM signal, said FM demodulator comprising:

- a phase comparator having a first input, a second input and an output, said first input being coupled to the first input terminal of said FM demodulator and said output being coupled to the output terminal of said FM demodulator;
- a first tunable phase shifting means coupled between the second input terminal of said FM demodulator and the second input of said phase comparator, said first phase shifting means having a tuning control input for controlling a tuning frequency of said first phase shifting means; and
- a feedback path coupling the output of said phase comparator to said tuning control input, said feedback path comprising a loop filter, characterized in that said feedback path further comprises a compensation filter having a transfer characteristic substantially corresponding to an inverse transfer characteristic of said first phase shifting means transposed to baseband, said loop filter comprises a first-order low-pass filter having a cut-off frequency which is lower than a lowest frequency in the modulation of the FM modulated input signals, and the FM demodulator further comprises:

- means for providing a variable loop gain; and
- a first control terminal coupled to a variable gain control input of said means for providing a variable loop gains, said receiver further comprising demodulator bandwidth control means coupled to the first control terminal of the FM demodulator for controlling the bandwidth of said FM demodulator.

10. A receiver for receiving FM signals, comprising an RF stage, an IF stage, an FM demodulator, and an LF stage, said FM demodulator having a first input terminal and a second input terminal for receiving FM modulated input signals having a 90° degree phase relation, and an output terminal for supplying a demodulated FM signal, said FM demodulator comprising:

- a phase comparator having a first input, a second input and an output, said first input being coupled to the first input terminal of said FM demodulator and said output being coupled to the output terminal of said FM demodulator;
- a first tunable phase shifting means coupled between the second input terminal of said FM demodulator and the second input of said phase comparator, said first phase shifting means having a tuning control input for controlling a tuning frequency of said first phase shifting means; and
- a feedback path coupling the output of said phase comparator to said tuning control input, said feedback path comprising a loop filter, characterized in that said feedback path further comprises a compensation filter having a transfer characteristic substantially corresponding to an inverse transfer characteristic of said first phase shifting means transposed to baseband, and characterized in that said FM demodulator further comprises a second control terminal coupled to a bandwidth control input of said phase shifting means for controlling the bandwidth of said phase shifting means and coupled to a control input of said compensation filter for matching the transfer characteristic of said compensation filter in accordance with the bandwidth of said phase shifting means, said receiver further comprising further bandwidth control means (60) coupled to the second control terminal (15) of the FM demodulator (30) for supplying a bandwidth control signal to said second control terminal (15).

\* \* \* \* \*